United States Patent
Huott et al.

(10) Patent No.: US 9,627,012 B1
(45) Date of Patent: Apr. 18, 2017

(54) SHIFT REGISTER WITH OPPOSITE SHIFT DATA AND SHIFT CLOCK DIRECTIONS

(71) Applicant: International Business Machines Corporation, Armonk, NY (US)

(72) Inventors: William V. Huott, Holmes, NY (US); Norman K. James, Liberty Hill, TX (US); Pradip Patel, Poughkeepsie, NY (US); Daniel Rodko, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/197,271

(22) Filed: Jun. 29, 2016

(51) Int. Cl.
*G11C 19/00* (2006.01)
*G11C 7/10* (2006.01)
*G11C 8/04* (2006.01)

(52) U.S. Cl.
CPC . *G11C 7/10* (2013.01); *G11C 8/04* (2013.01)

(58) Field of Classification Search
CPC .................................................. G11C 19/00

USPC ........................................................ 365/78–93
See application file for complete search history.

(56) References Cited

U.S. PATENT DOCUMENTS

| | | | |
|---|---|---|---|
| 3,430,001 A | 2/1969 | Gianola et al. | |
| 5,168,463 A * | 12/1992 | Ikeda ................... | G11C 19/28 326/95 |
| 5,282,234 A | 1/1994 | Murayama et al. | |
| 6,496,966 B1 | 12/2002 | Barney et al. | |
| 6,539,509 B1 | 3/2003 | Teene | |
| 6,829,191 B1 * | 12/2004 | Perner ................... | G11C 11/16 365/189.08 |
| 7,764,264 B2 | 7/2010 | Nakao et al. | |

* cited by examiner

*Primary Examiner* — Harry W Byrne
(74) *Attorney, Agent, or Firm* — Cantor Colburn LLP; Margaret A. McNamara

(57) ABSTRACT

Aspects include a computer-implemented method for scanning data into a shift register. The method includes receiving, by a circuit, a data signal, wherein the data signal propagates in a first direction; and receiving, by the circuit, a clock signal, wherein the clock signal propagates in a second direction, wherein the second direction is in a reverse direction of the first direction.

14 Claims, 6 Drawing Sheets

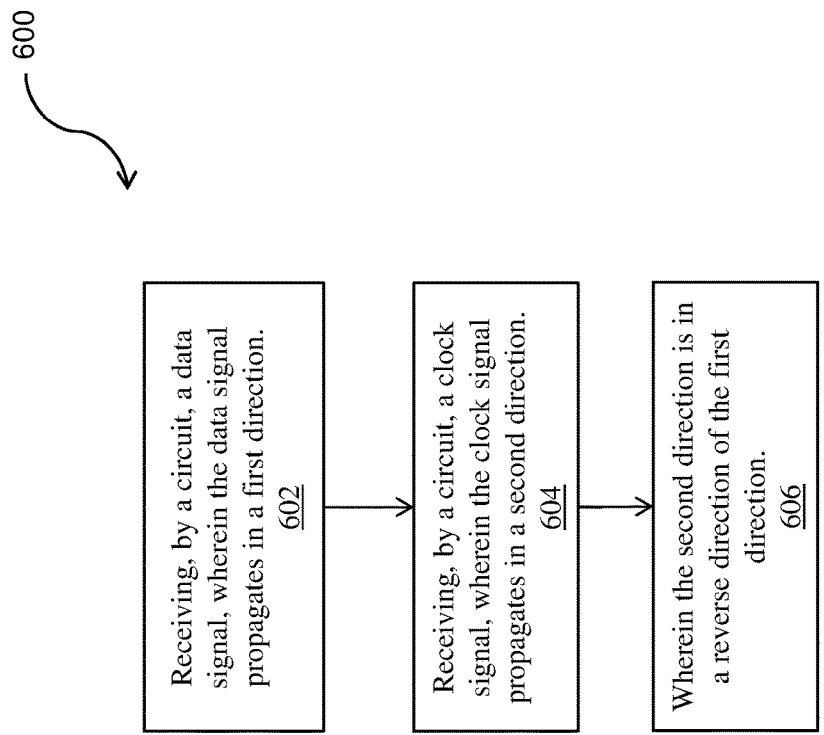

SHIFT REGISTER WITH OPPOSITE SHIFT DATA AND SHIFT CLOCK DIRECTIONS

BACKGROUND

The present disclosure relates generally to a shift register, and more specifically, to a shift register with opposite shift data and shift clock directions.

Shift registers, also known as shift rings, scan rings, or scan registers, are used as elements for moving digital data serially though digital semiconductor chips. Sequential logic latches in semiconductor chip designs are connected as part of some chip pervasive shift register. In many cases, shift rings are a form of serial communication and test access to semiconductor chips. These shift registers are connected to a grid clock or clock tree that is pervasively wired across large sections of the chip due to the need for shift register designs to operate synchronously.

Because current shift register designs operate synchronously across large sections of a semiconductor chip, their clocks are often connected to the existing functional clock grids or clock trees through shift register clock drivers. Since most chip pervasive shift registers are only used for chip initialization, servicing, and test access, the capacitive and resistive clock loads of these many shift register clock drivers connected to the functional clock grids are always burning power, non-productively, during the functional operation of the semiconductor chip because these shift registers are usually not in use.

SUMMARY

According to embodiments, a shift register with opposite shift data and shift clock directions is described. The shift register includes one or more circuit blocks coupled serially, wherein a data-out port of a preceding circuit block is coupled to a data-in port of a succeeding circuit block and wherein a clock-out port of the preceding circuit block is coupled to a clock-in port of the succeeding circuit block, and wherein the one or more circuit blocks are configured to: receive a data-in signal into the data-in port of a first of the one or more circuit blocks; transmit a data-out signal from the data-out port of a last of the one or more circuit blocks, wherein the data-in signal and the data-out signal propagate in a first direction; receive a clock-in signal into the clock-in port of a last of the one or more circuit blocks; and transmit a clock-out signal from the clock-out port of a first of the one or more circuit block, wherein the clock-in signal and the clock-out signal propagate in a second direction, wherein the second direction is in a reverse direction of the first direction.

In accordance with an embodiment of the invention, a method for scanning data into a circuit is described. The method includes receiving, by a circuit, a data signal, wherein the data signal propagates in a first direction; and receiving, by the circuit, a clock signal, wherein the clock signal propagates in a second direction, wherein the second direction is in a reverse direction of the first direction.

In accordance with another embodiment of the invention, a computer program product for scanning data into a circuit is described. The computer program product comprises a computer readable storage medium having program instructions embodied therewith, the program instructions executable by a processor located on a device to cause the computer processor to perform a method. The method includes receiving, by a circuit, a data signal, wherein the data signal propagates in a first direction; and receiving, by the circuit, a clock signal, wherein the clock signal propagates in a second direction, wherein the second direction is in a reverse direction of the first direction.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 6 is a block diagram illustrating a method for scanning data into a circuit in accordance with one or more embodiments.

DETAILED DESCRIPTION

In accordance with embodiments of the disclosure, a shift register with opposite shift data and shift clock directions is provided. Embodiments described herein include a shift register with multiple latches coupled serially with a data-in signal inputted into the first latch in the series of multiple latches. The shift register has a clock-in signal inputted into the last latch in the series of multiple latches. In exemplary embodiments, the data-in signal propagates in a first direction and the clock-in signal propagates in a second direction and the first direction of the data-in signal is the reverse of the second direction of the clock-in signal.

Figure 1:
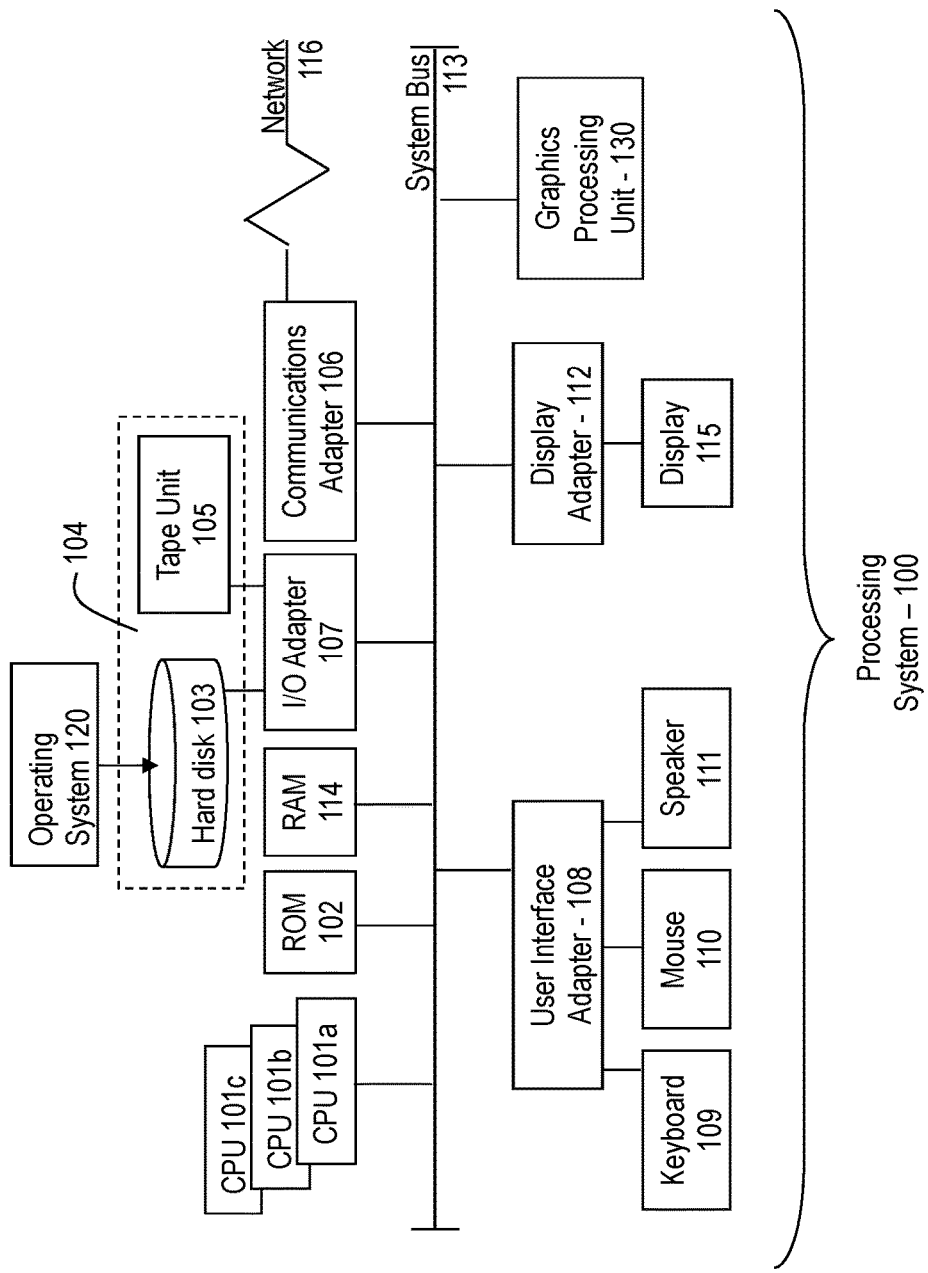
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adapter 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. The system 100 can be implemented in order to perform the testing of various semiconductors and IC devices.

Figure 2:
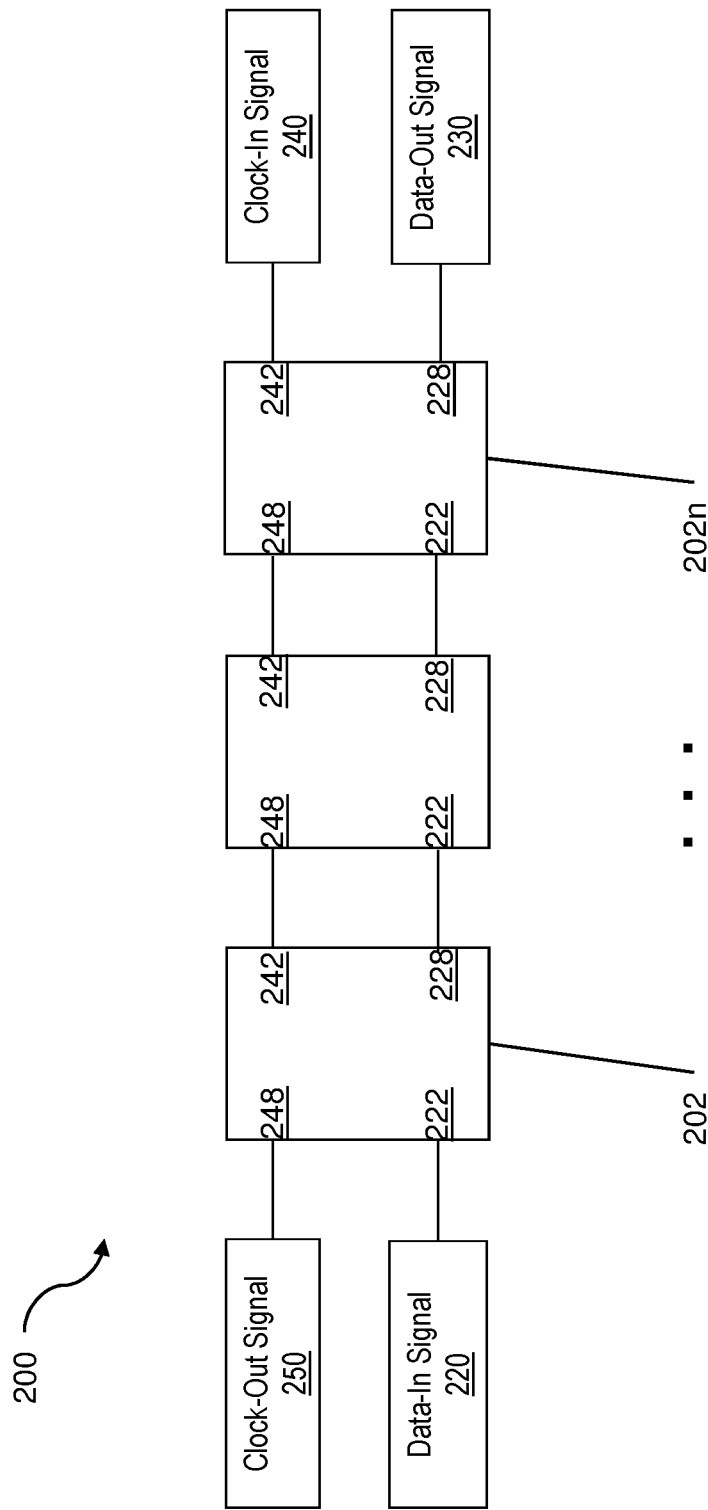
FIG. 2 is a block diagram of a shift register with opposite shift data and shift clock directions in accordance with one or more embodiments.

FIG. 2 illustrates a block diagram 200 of a shift register with opposite shift data and shift clock directions according to one or more embodiments. The block diagram 200 includes multiple circuit blocks 202 . . . 202n. The circuit blocks 202 . . . 202n each include a data-in port 222, a data-out port 228, a clock-in port 242, and a clock-out port 248. The first circuit block 202 includes a data-in port 222 which receives the data-in signal 220. The data-out port 228 of a preceding circuit block is coupled to the data-in port 222 of the succeeding circuit block. The last circuit block 202n includes a data-out port 228 which outputs the data-out signal 230. The last circuit block 202n also includes a clock-in port 242 which receives the clock-in signal 240. The clock-out port 248 of a succeeding circuit block is coupled to the clock-in port 242 of the preceding circuit block. The first circuit block 202 includes a clock-out port 248 which outputs the clock-out signal 250. In the illustrated embodiment, the block diagram 200 shows three circuit blocks 202; however, in one or more embodiment, the block diagram 200 can contain any number of circuit blocks 202.

Figure 3:
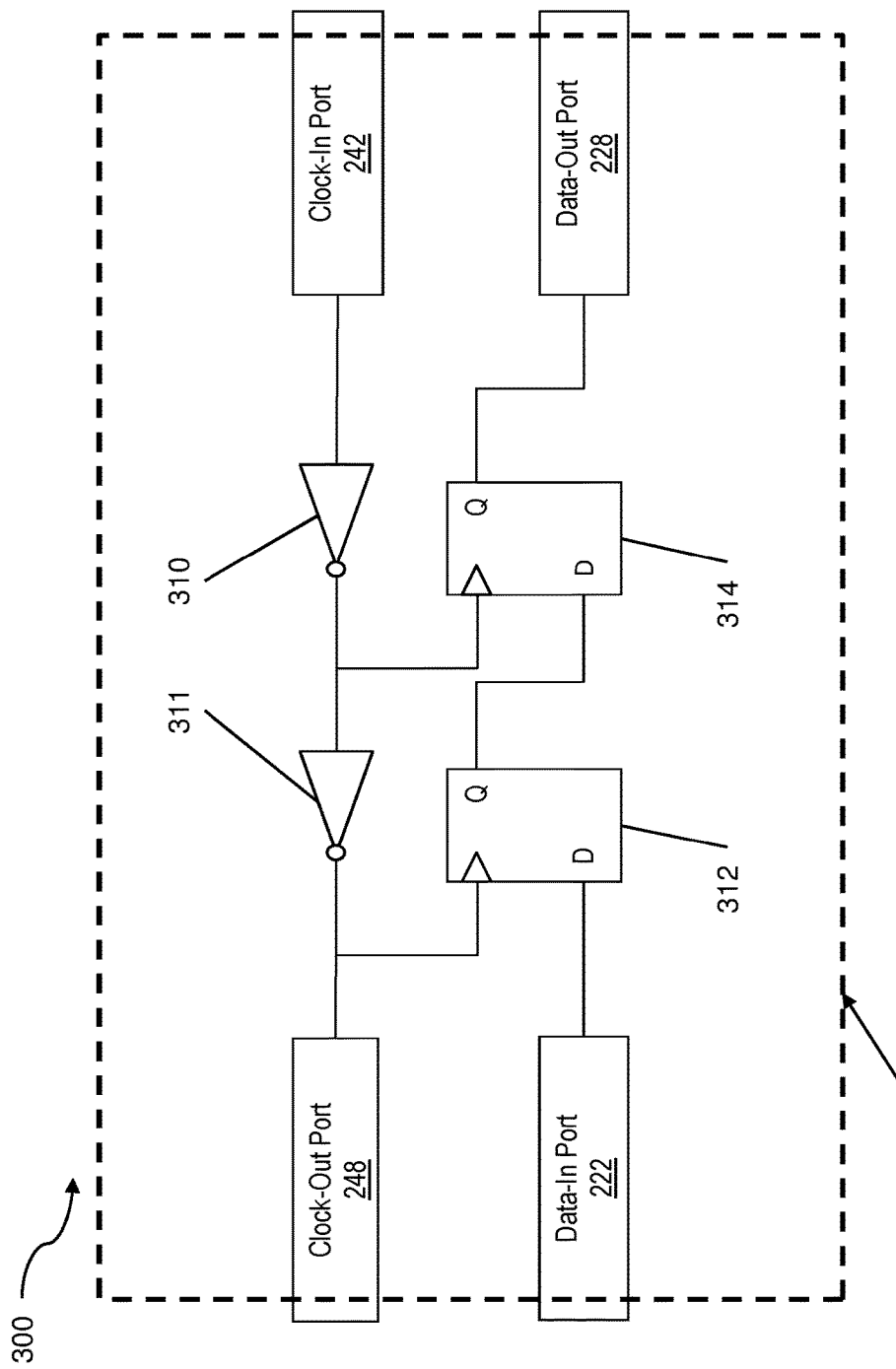
FIG. 3 is a circuit diagram of a shift register with opposite shift data and shift clock directions in accordance with one or more embodiments.

FIG. 3 illustrates a circuit diagram 300 of a shift register with opposite shift data and shift clock directions according to one or more embodiments. The circuit diagram 300 includes the circuit block 202 which includes a first and a second latch (312, 314), a first and a second inverting delay circuit (310, 311), the data-in port 222, the data-out port 228, the clock-in port 242, and the clock-out port 248.

In the illustrated embodiment, the first and the second latches (312, 314) appear as D-type flip flop; however, any type of latch can be used such as, for example, RS-type latches and JK flip flops or any type of bistable multivibrator. The latches may be asynchronous or synchronous. The terms latch and flip flop are used here interchangeably. The first and second latches (312, 314) are arranged serially where the output Q of the first latch 312 is coupled to the input D of the second latch 314.

The data-in port 222 is configured to receive a data-in signal 220 which propagates in a first direction towards input D of the first latch 312. The data-out signal at output Q of the first latch 312 flows into the input D of the second latch 314. The data-out port 228 is the output Q of the second latch 314 and is configured to send the data-out signal 230.

In one or more embodiments, the clock-in port 242 is configured to receive a clock-in signal 240 which propagates in a second direction. The second direction of the clock-in signal 240 is the reverse of the first direction of the data-in signal 240. The clock-in signal 240 propagates into the clock-in port 242 which is the input of the first inverting delay circuit 310. The first inverting delay circuit 310 output is coupled to the clock port of the second latch 314 and the input of the second inverting delay circuit 311. The second inverting delay circuit 311 output is coupled to the clock port of the first latch 312 and is the clock-out port 248.

In the illustrated embodiment, the first and second inverting delay circuits 310, 311 are inverting buffers; however, in one or more embodiments, the first and second delay circuits 310, 311 can be any type of inverting delay circuit such as, for example, 3 inverting buffers (or any odd number of inverting buffers).

In one or more embodiments, the clock-in signal 240 originates from a clock generator which can be any of a single-phase clock, two-phase clock, four phase clock, clock multiplier or the like. In an embodiment, the clock-in signal 240 can be a scan-in or shift clock signal originating from a scan or shift clock.

In the illustrated embodiment, the circuit diagram 300 of a shift register is arranged in a configuration that is serial-in/serial-out. However, in one or more embodiments, the circuit diagram 300 for a shift register may be arranged in a configuration that is parallel-in/serial-out, serial-in/parallel-out, parallel-in/parallel-out, and also configured as a ring counter.

Figure 4:
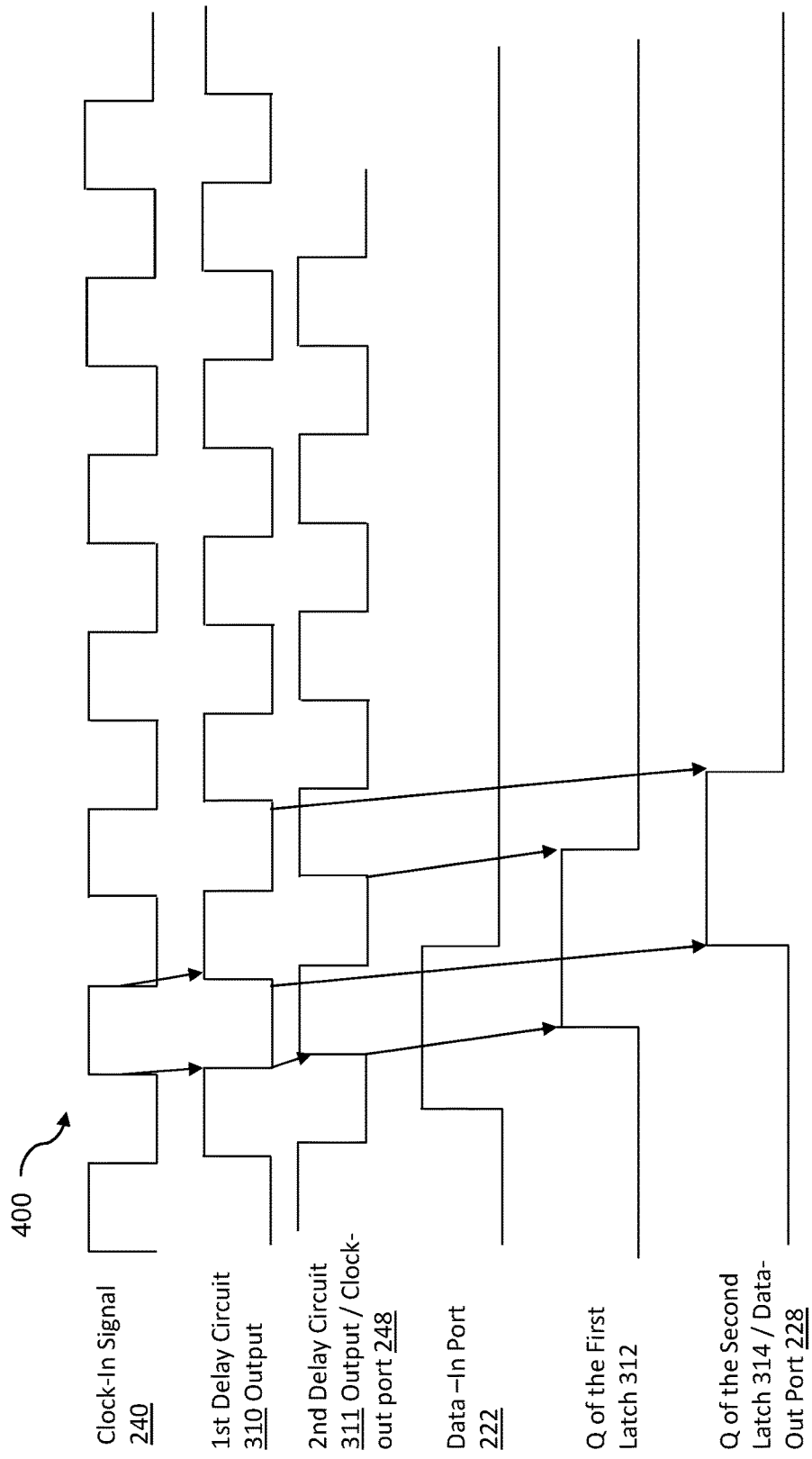
FIG. 4 is a timing diagram of a shift register with opposite shift data and shift clock directions in accordance with one or more embodiments.

FIG. 4 illustrates a timing diagram 400 of the circuit diagram 300 of the shift register from FIG. 3 according to one or more embodiments. The timing diagram 400 includes a clock-in signal 240, a first delay circuit 310 output, a second delay circuit 311 output which is also the clock-out port 248, the data-in port 222 which receives the data-in signal 220, the Q output of the first latch 312, and the Q output of the second latch 314 which is also the data-out port 228. The second inverting delay circuit 311 output can not go high or "on" until after the first inverting data circuit 310 output goes low or "off". This can provide for the Q output of the first latch 312 to not switch until after the clock to the second latch 314 is "off".

In one or more embodiments, the clock-in signal 240 is a square wave with a 50% duty cycle with a fixed frequency. The first inverting delay circuit 310 output is an inverting buffer, with an initial low position, which delays the clock-in signal 240 by one inverter delay. The second inverting delay circuit 311 output is an inverting buffer, with an initial high position, which delays the clock-in signal 240 by one additional inverter delay. The first and second inverting delay circuits 310 and 311, being local to or constructed as part of their corresponding latches (314 and 312 respectively), provide for their corresponding latches to see a clock edge transition prior to any shift data transition by virtue of a propagation delay. This embodiment provides for each latch to shift on every other clock edge without the need for any clock versus data timing race analysis. In FIG. 2, the data-in port 222 receives the data-in signal 220 which starts out low and rises to a high state as shown in the timing diagram in FIG. 4. The Q output of the first latch 312 shows the output of the data signal after leaving the first latch 312. The first latch 312 is triggered when the clock input for the first latch (i.e. the second delay circuit 311 output) has a rising edge. As shown in the timing diagram 400 in FIG. 4, the Q output of the first latch 312 changes from low to high on the next rising edge of the second delay circuit 311 output after the data-in signal 220 changes from low to high. This process is the same for the Q output of the second latch 314/data-out port 228 on the following rising edge of the first delay circuit 310 output after the data-in signal 220 transitions from low to high.

The illustrated embodiment shows a rising or positive edge triggered latch. However, in one or more embodiments, the first and second latch (312, 314) may be falling or negative edge triggered latches or edge triggered latches.

Figure 5:
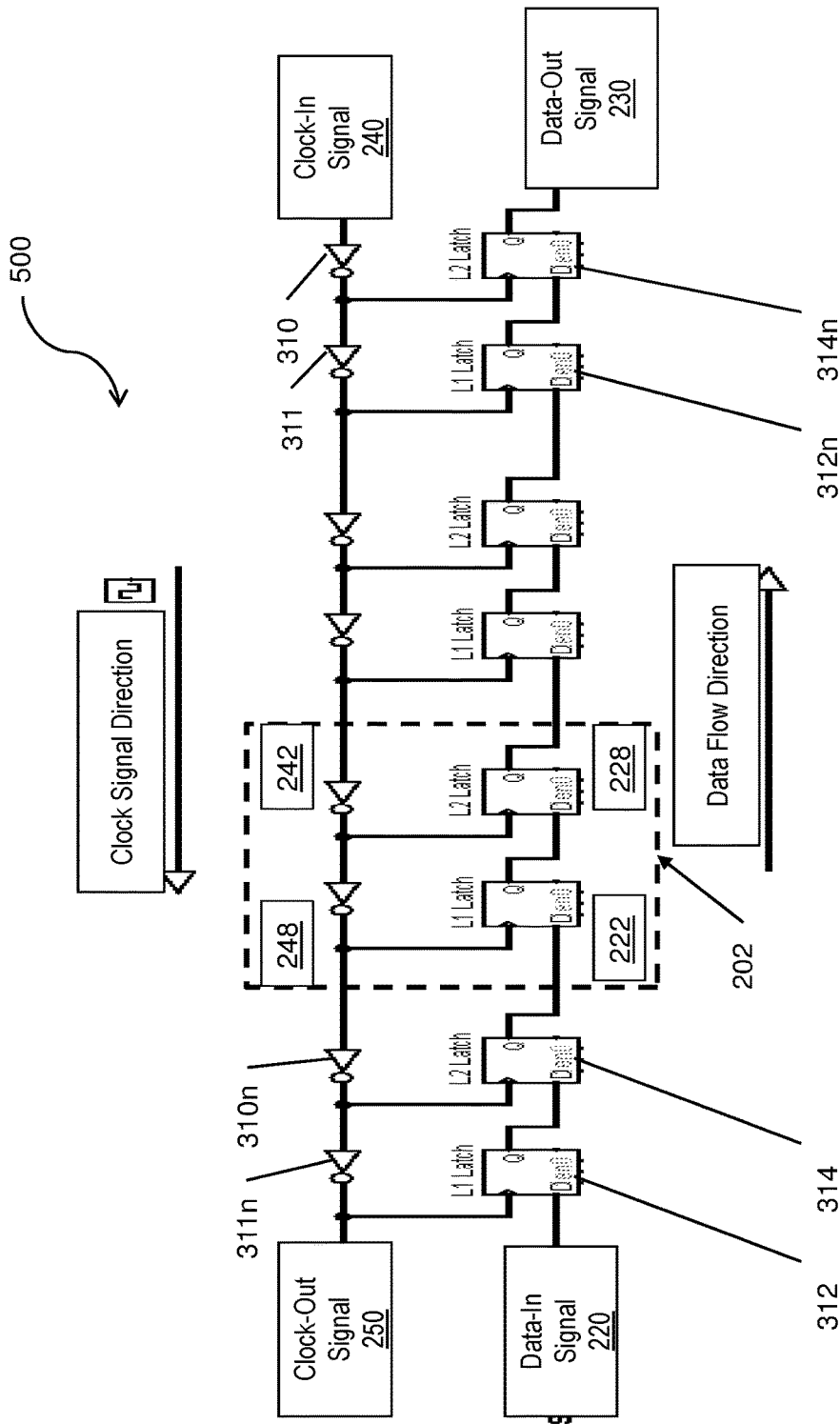
FIG. 5 is a circuit diagram of shift register illustrating another exemplary embodiment for a shift register with opposite shift data and shift clock directions.

FIG. 5 illustrates a circuit diagram of an 8 bit shift register 500 according to one or more embodiments. The 8 bit shift register contains sets of first and second latches (312, 314 . . . 312n, 314n) as previously illustrated in FIG. 3. These sets of first and second latches are illustrated as circuit blocks 202 in FIG. 2. As shown in the illustrated embodiment, the circuit blocks are coupled serially where the data-out port 228 of the preceding circuit block is coupled to the data-in port 222 of the succeeding circuit block. A succeeding circuit block's clock-out port 248 is coupled to the preceding circuit block's clock-in port 242. The data-in signal 220 flows in from an opposite direction of the clock-in signal 240.

In one or more embodiments, on the data-in signal 220 side of the shift register, the shift register would provide a First-In, First-Out (FIFO) type structure utilizing the semi-asynchronous clock-out signal 250 as the clock input for the FIFO structure to feed a new data-in signal into a shift register. This FIFO type structure would be used to synchronize the semi-asynchronous style operation of this shift register design back to the grid synchronous operation of the rest of the chip. One of ordinary skill in the art can appreciate that asynchronous or semi-asynchronous FIFO implementations are a common element.

FIG. 6 illustrates a block diagram of a method for scanning data into a circuit according to one or more embodiments. The method 600 includes receiving, by a circuit, a data signal, wherein the data signal propagates in a first direction as shown at block 602. Next, at block 604, the method 600 includes receiving, by a circuit, a clock signal, wherein the clock signal propagates in a second direction. At block 606, the method 600 includes wherein the second direction is in a reverse direction of the first direction.

Additional processes may also be included. It should be understood that the processes depicted in FIG. 6 represent illustrations, and that other processes may be added or existing processes may be removed, modified, or rearranged without departing from the scope and spirit of the present disclosure.

Technical effects and benefits include a shift register design that eliminates the need to be connected to any clock grid or clock tree and eliminates the need for shift register local clock grid or tree drivers. This eliminates the power, area, and wiring channel overhead of adding local shift register clock grid or tree driver circuitry connected to the clock grid. This also eliminates the need for synchronously latch pipelined clock gating signal trees to be pipelined across large areas of a chip. This also eliminates high frequency delta-I noise of a full synchronous design by cascading the clock and data along the shift register length (in opposite direction), spreading currents out over time. Also, it eliminates the need for aggressive "fast path" or "early mode" timing between scan latches in the shift register (including the elimination of "timing delay pad" circuits). Finally, this design provides natural "hazard-free" timing by construction for all data and clock paths in the shift register design.

In one or more embodiment, the method of shift clocking in the opposite direction of the shift data flow can be used for any type of master/slave shift latch configuration.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A shift register comprising:
   one or more circuit blocks coupled serially, wherein a data-out port of a preceding circuit block is coupled to a data-in port of a succeeding circuit block and wherein a clock-out port of the preceding circuit block is coupled to a clock-in port of the succeeding circuit block, and wherein the one or more circuit blocks are configured to:
   receive a data-in signal into the data-in port of a first of the one or more circuit blocks;
   transmit a data-out signal from the data-out port of a last of the one or more circuit blocks, wherein the data-in signal and the data-out signal propagate in a first direction;
   receive a clock-in signal into the clock-in port of a last of the one or more circuit blocks; and
   transmit a clock-out signal from the clock-out port of a first of the one or more circuit block, wherein the clock-in signal and the clock-out signal propagate in a second direction,
   wherein the second direction is in a reverse direction of the first direction.

2. The shift register of claim 1, wherein each of the one or more circuit blocks comprise:
   a first and a second latch coupled serially, wherein the first and the second latch each contain a clock port, a data input port, and a data output port:
   wherein the data output port of the first latch is coupled to the data input port of the second latch; and
   wherein the data-in port of the first latch is configured to receive the data-in signal;
   a first and a second delay circuit coupled serially, wherein the first and the second delay circuit each contain a clock input port and a clock output port:
   wherein the output port of the first delay circuit is coupled to the input port of the second delay circuit and the clock port of the second latch;
   wherein the input port of the first delay circuit is configured to receive the clock-in signal;
   wherein the output port of the second delay circuit is coupled to the clock port of the first latch and wherein the output port of the second delay circuit is the clock-out port; and
   wherein the data output port of the second latch is configured to transmit the data-out signal.

3. The shift register of claim 2, wherein the first and the second delay circuits are inverting buffers.

4. The shift register of claim 1, wherein the clock-in signal is a scan clock input.

5. The shift register of claim 2, wherein the first and the second latches are asynchronous.

6. The shift register of claim 1, wherein the clock-out port of the first of the one or more circuit blocks is configured to transmit a clock-in signal for a different shift register.

7. A method for scanning data into a circuit, the method comprising:
    receiving, by a circuit, a data signal, wherein the data signal propagates in a first direction; and
    receiving, by the circuit, a clock signal, wherein the clock signal propagates in a second direction,
    wherein the second direction is in a reverse direction of the first direction.

8. The method of claim 7, wherein the circuit is a shift register.

9. The method of claim 8, wherein the shift register is at least one of a serial-in serial-out shift register, a serial-in parallel-out shift register, a parallel-in serial-out shift register, and parallel-in parallel-out shift register.

10. The method of claim 8, wherein the shift register is asynchronous.

11. A computer program product for scanning data into a circuit, the computer program product comprising a computer readable storage medium having program instructions embodied therewith, wherein the computer readable storage medium is not a transitory signal per se, the program instructions executable by a processing circuit to cause the processing circuit to perform a method comprising:
    receiving, by a circuit, a data signal, wherein the data signal propagates in a first direction; and
    receiving, by the circuit, a clock signal, wherein the clock signal propagates in a second direction,
    wherein the second direction is in a reverse direction of the first direction.

12. The method of claim 11, wherein the circuit is a shift register.

13. The method of claim 12, wherein the shift register is at least one of a serial-in serial-out shift register, a serial-in parallel-out shift register, a parallel-in serial-out shift register, and parallel-in parallel-out shift register.

14. The method of claim 13, wherein the shift register is asynchronous.

\* \* \* \* \*